United States Patent
Priel et al.

(10) Patent No.: US 9,337,717 B2
(45) Date of Patent: May 10, 2016

(54) SYSTEM ON A CHIP, APPARATUS AND METHOD FOR VOLTAGE RIPPLE REDUCTION ON A POWER SUPPLY LINE OF AN INTEGRATED CIRCUIT DEVICE OPERABLE IN AT LEAST TWO MODES

(75) Inventors: Michael Priel, Netanya (IL); Dan Kuzmin, Givat Shmuel (IL); Sergey Sofer, Rishon Lezion (IL)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 14/415,611

(22) PCT Filed: Jul. 19, 2012

(86) PCT No.: PCT/IB2012/053677
§ 371 (c)(1),
(2), (4) Date: Jan. 19, 2015

(87) PCT Pub. No.: WO2014/013292
PCT Pub. Date: Jan. 23, 2014

(65) Prior Publication Data
US 2015/0162818 A1  Jun. 11, 2015

(51) Int. Cl.
*H02M 1/15* (2006.01)
*G05F 1/613* (2006.01)
*G06F 1/26* (2006.01)
*H01L 23/60* (2006.01)

(52) U.S. Cl.
CPC .................. *H02M 1/15* (2013.01); *G05F 1/613* (2013.01); *G06F 1/26* (2013.01); *H01L 23/60* (2013.01); *H01L 2924/0002* (2013.01)

(58) Field of Classification Search
CPC ............ H02M 1/15; G05F 1/613; G06F 1/26; H01L 23/60
See application file for complete search history.

(56) References Cited

U.S. PATENT DOCUMENTS

| | | | |
|---|---|---|---|
| 4,092,609 A | 5/1978 | Kaplan | |
| 4,594,648 A * | 6/1986 | Gallios | 327/552 |
| 5,706,187 A * | 1/1998 | Nakamura | 363/55 |
| 6,377,033 B2 * | 4/2002 | Hsu | 323/274 |
| 6,717,389 B1 | 4/2004 | Johnson | |
| 6,734,718 B1 | 5/2004 | Pan | |
| 7,157,891 B1 | 1/2007 | Drury et al. | |
| 7,633,773 B2 | 12/2009 | Chen | |
| 2001/0015637 A1 | 8/2001 | Nishiyama | |
| 2006/0012346 A1 * | 1/2006 | Huang et al. | 323/222 |
| 2007/0260898 A1 * | 11/2007 | Burton et al. | 713/300 |
| 2012/0051108 A1 | 3/2012 | Leu et al. | |
| 2012/0194953 A1 * | 8/2012 | Mikolajczak | 361/56 |

OTHER PUBLICATIONS

International Search Report and Written Opinion correlating to PCT/IB2012/053677 dated Feb. 21, 2013.

* cited by examiner

*Primary Examiner* — Jue Zhang

(57) ABSTRACT

An apparatus for voltage ripple reduction on a power supply line of an integrated circuit device is provided to be operable in at least two modes. The apparatus includes: one or more clamping devices connectable to the power supply line; a clamp control unit; and a mode change detection unit arranged to monitor an interface of the integrated circuit device for one or more information indicating an upcoming mode change of the integrated circuit device and to provide a mode change signal to the clamp control unit when the one or more information is detected. The clamp control unit is arranged to connect at least one of the one or more clamping devices to the power supply line when receiving the mode change signal.

17 Claims, 3 Drawing Sheets

SYSTEM ON A CHIP, APPARATUS AND METHOD FOR VOLTAGE RIPPLE REDUCTION ON A POWER SUPPLY LINE OF AN INTEGRATED CIRCUIT DEVICE OPERABLE IN AT LEAST TWO MODES

FIELD OF THE INVENTION

This invention relates to a system on a chip, an apparatus and a method for voltage ripple reduction on a power supply line of an integrated circuit device operable in at least two modes.

BACKGROUND OF THE INVENTION

In order to operate properly, an integrated circuit (IC) connected to a power supply needs to be supplied with a DC voltage whose level remains constant within a certain tolerance range. Integrated circuits comprising modern application processors are provided in packages which may introduce parasitic resistances R, inductances L and capacitances C which may result in a distinct dependency of the voltage supplied to the integrated circuit device on the characteristic over time of the current consumed by the integrated circuit device. High current consumption may, for example, be accompanied by a drop in the supply voltage, whereas fast, sharp changes of the consumed current may be accompanied by high frequency portions or voltage ripples added to the DC voltage signal received from the power supply.

Referring to FIG. 1, a sketch of a prior art supply voltage reaction on a sharp IC current change is schematically shown. The sketch illustrates a characteristic over time t of a supply voltage level U 10 provided to an integrated circuit in response to a sharp change of the IC current 12 drawn from the power supply. As shown, the supply voltage level 10 exhibits voltage ripples caused by the current level change at time T. These ripples may, for example, be reduced by employing an on-die decoupling capacitor.

In U.S. Pat. No. 6,717,389, a method for transient voltage reduction in a current controlled voltage regulator is described. It is shown that an always opened and controlled current source can be added in parallel to the actual current load to keep a total regulator current constant.

In U.S. Pat. No. 7,633,773, an on-die anti-resonance structure for an integrated circuit is described. The structure may reduce the effects of chip-package resonance in an integrated circuit assembly. This includes employing a series RLC circuit to reduce the output impedance of the power delivery system at the resonance frequency.

SUMMARY OF THE INVENTION

The present invention provides a system on a chip, an apparatus and a method for voltage ripple reduction on a power supply line of an integrated circuit device operable in at least two modes as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary, as illustrated, for the understanding and appreciation of the underlying concepts of the present invention and in order not to obfuscate or distract from the teachings of the present invention.

Figure 2:
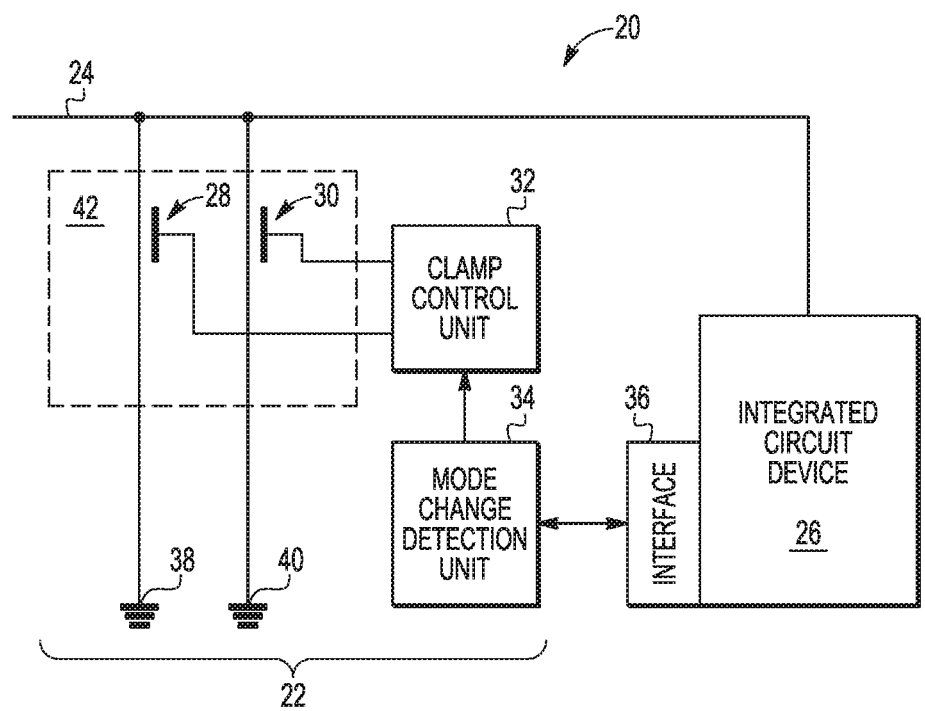
FIG. 2 schematically shows a circuit diagram of an example of an embodiment of a system on a chip with an embodiment of an apparatus for voltage ripple reduction on a power supply line of an integrated circuit device operable in at least two modes.

Referring to FIG. 2, a circuit diagram of an example of an embodiment of a system on a chip 20 with an embodiment of an apparatus 22 for voltage ripple reduction on a power supply line 24 of an integrated circuit device 26 operable in at least two modes is schematically shown. The apparatus 22 for voltage ripple reduction on a power supply line 24 of an integrated circuit device 26 operable in at least two modes comprises one or more clamping devices 28, 30 connectable to the power supply line 24; a clamp control unit 32; and a mode change detection unit 34 arranged to monitor an interface 36 of the integrated circuit device 26 for one or more information indicating an upcoming mode change of the integrated circuit device 26 and to provide a mode change signal to the clamp control unit 32 when the one or more information is detected; wherein the clamp control unit 32 is arranged to connect at least one of the one or more clamping devices 28, 30 to the power supply line 24 when receiving the mode change signal. The provided apparatus 22 may allow for higher operation frequency and/or lower power consumption of the integrated circuit device 26.

The power supply line 24 may, for example, be connected to a pin for connecting the system on a chip 20 to a power supply. The integrated circuit device 26 may be any suitable device and, for example, be a processing device, such as a microprocessor, a graphics processing unit, or a microcontroller unit, just to name a few, or it may, for example, be a module, e.g., a processing core, of a system on a chip 20. As shown, the integrated circuit device 22 may be, or be part of, a system on a chip 20 e.g. used in an embedded system. Also, the integrated circuit device 22 may be part of a system comprising several chips. As another example, the integrated circuit device 26 may be a memory device, such as random access memory (RAM) device.

The integrated circuit device 22 may be operable in at least two modes, for example a sleep mode, stand-by mode or low power mode and a normal operation mode or full power mode. As another example, the different modes, usually of processing devices or graphics processing units, may be different voltage modes when using dynamic voltage scaling, such as overvolting and undervolting, as a power management technique, may be different frequency modes when using dynamic frequency scaling, such as processor throttling, as a power management technique, or to DVFS, i.e., combined Dynamic Voltage and Frequency Scaling, or other suitable modes.

The clamping device may be any device connectable to the power supply line 24 and arranged to, when in connecting state, allow a clamp current between the power supply line 24 and, for example, ground 38, 40 or any other current sink, such as a transistor, for example a field effect transistor or other transistor operated as a clamp device. For example, a field effect clamp transistor device may be referred to as in a connecting state when its path between source and drain terminals is in a conductive state for a current flow between said terminals.

The interface 36 of the integrated circuit device 26 may be any point of interaction between components where data communicated to and from the integrated circuit device 26 may be accessible. As an example, the interface may comprise an interrupt register of a processing device receiving interrupts related to the integrated circuit device 26 or a configuration register. The interface may, for example, be a register device, such as an interrupt register or configuration register, or any other point of interaction where any data communicated to and from the integrated circuit device 26 may be accessible for the mode change detection unit 34.

The mode change detection unit 34 may, for example, be any circuitry arranged to monitor the interface 36, i.e., to read the content or receive data or other signals sent to the interface 36, e.g., by monitoring the related traffic on a bus.

The mode change detection unit 34 may monitor the interface 36 for information indicating an upcoming mode change of the integrated circuit device 26. The information may, for example, be a trigger for initiating the mode change, such as a wake-up request for the integrated circuit device received during a low power mode, or other suitable signal or data or event. The information may be available before the actual mode change is carried out.

The mode change detection unit 34 may be arranged to provide the mode change signal to the clamp control unit 32 before the mode of the integrated circuit device 26 is changed. This may allow communicating the upcoming mode change which will result in a significant change of current consumed by the integrated circuit device 26 to the clamp control unit 32 early enough to connect at least one of the one or more clamping devices 28, 30 to the power supply line 24. For instance, prior to the actual mode change of the integrated circuit device 26, i.e., functionality change of the IC module, which may cause a current load step, the clamping device 28, 30 may be brought into connecting state and be opened, for example, gradually. This may initiate current through parasitic inductances. After the mode change, the clamping device(s) 28, 30 may be disconnected or shutdown again.

This may allow to have a clamp current flowing through the now connected clamping devices. The clamp current may be a portion of the current which otherwise would be entirely provided to the integrated circuit device 26. The amount of clamp current may depend on the number and physical characteristics of the connected clamping device. The clamp control unit 32 may, for example, be arranged to enable one more of the clamping devices 28, 30 with respect to the expected level of current change in the integrated circuit device, i.e., depending on the type of expected mode change.

The apparatus 22 may comprise an electrostatic discharge (ESD) current clamping structure 42 comprising the one or more clamping devices 28, 30. The ESD current clamping structure 42 may be a structure dedicated to protecting the integrated circuit device 26 from being damaged in the event of a high current received through the power supply line 24 due to an electrostatic discharge encountered, for example, at the power supply pin to which the power supply line 24 may connect. According to the presented embodiment of the apparatus, an ESD clamping structure 42, which may already be available for the purpose of ESD protection of the integrated circuit device 26, may also be used for voltage ripple reduction by smoothing the current into the integrated circuit device 26 by means of an additional clamp current through the one or more clamping devices 28, 30. This may save die area as compared to, for example, a solution using an on-die decoupling capacitor.

The clamp control unit 32 may further be arranged to connect the one or more clamping devices 28, 30 to the power supply line 24 when receiving an electrostatic discharge trigger signal. In other words, the clamp control unit may be arranged to perform the functionality required for ESD protection and it may also be able to perform the functionality of mode change signal triggered controlling of the clamping devices 28, 30 for voltage ripple reduction.

At least one of the one or more clamping devices 28, 30 may, for example, be a field effect transistor (FET) circuit, which may easily be integrated. It may, for example, be an ESD FET clamp transistor or a transistor being part of a larger ESD FET clamp structure. As an example, an ESD "bigFET" device, which may be connected between each power supply line and ground on the die, may be used for ESD protection as well as for generating controllable current from the power supply line 24 for smoothing an expected sharp current change and, thereby, reduce or avoid ripples in the supply voltage. In other embodiments, other clamping devices, such as other types of transistor circuits may be used.

In an embodiment of the apparatus 22, the clamp control unit 32 may be arranged to select a specific conductivity level detected when connecting the at least one of the one or more clamping devices 28, 30 to the power supply line 24. The clamping device may be partially opened and may allow to carry a lower clamp current when the mode change is detected than during, for example an ESD event. This may, for example, be achieved by using a reduced gate control voltage in case the clamping device is a FET, as shown in FIG. 2. It may also be possible to open the respective gate such that a big slope waveform for the gate control, e.g. a triangular shaped control of the gate, is realized.

The clamp control unit 32 may, for example, be arranged to connect a set, which depends on which specific information is detected, i.e., the clamp control unit 32 may be arranged to select which or how many of the clamping devices 28, 30 to connect to the power supply line 24 depending on the type of mode change signalled by the one or more detected information.

At least one of the one or more information may, for example, be a wake-up request for the integrated circuit device 26. It may, for example, be an interrupt request for a wake-up, i.e., a wake-up signal, detected, e.g., in an interrupt register. This information may be issued prior to switching the integrated circuit device 26 from a low power mode to a normal operation mode.

The mode change detection unit 34 may allow detecting more than one type of information, each indicative for the same type of mode change or for different types of mode change of the integrated circuit device 26. It may, for example, also allow issuing different mode change signals depending on the detected upcoming mode change or mode changes.

At least one type of information may, for example, be a voltage scaling request for the integrated circuit device 26, which may be used for processing devices or graphics processing units when using dynamic voltage scaling. It should be noted that some changes may occur simultaneously. As an example, performing a wake up procedure may comprise a dynamic voltage scaling. As another example, the type may be a frequency scaling request for the integrated circuit device or an information regarding a combined DVFS.

As shown in FIG. 2, a system on a chip, SoC, 20 may comprise an integrated circuit device 22 operable in at least two modes, an interface 36 of the integrated circuit device 26 and an apparatus 20 for voltage ripple reduction on a power supply line 24 of the integrated circuit device 26 as described above. A system on a chip (SOC) may be an integrated circuit that integrates all components of an electronic system into a single chip. The integrated circuit device 26 shown in FIG. 2 may be regarded as a module of the SOC 20 that shares a common IC die with, for example, the apparatus 22.

Figure 1:
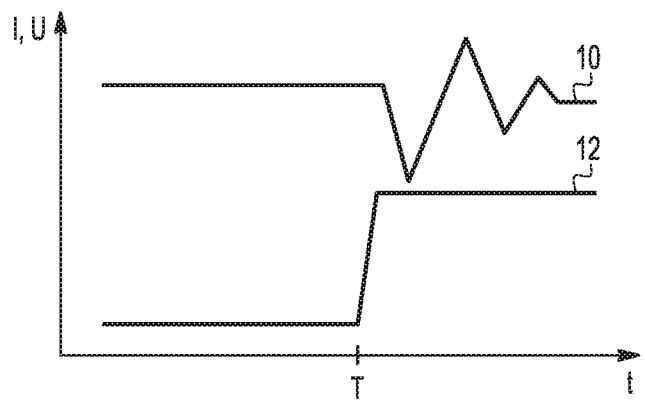
FIG. 1 schematically shows a sketch of a prior art supply voltage reaction on a sharp IC current change.
Figure 3:
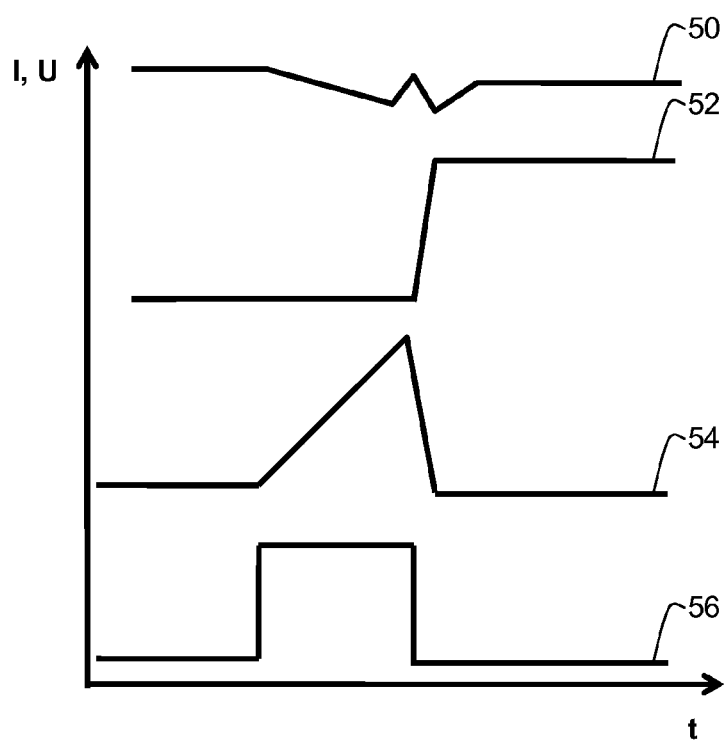
FIG. 3 schematically shows a sketch of a supply voltage, clamp current and clamp control voltage reaction on a sharp IC current change.

Referring to FIG. 3, a graph of a supply voltage 50, clamp current 54 and clamp control voltage 56 as a function of time illustrating a reaction on a sharp IC current 52 change is schematically shown. When comparing the supply voltage 50 of FIG. 3 with the supply voltage shown in FIG. 1, it can be seen that voltage ripples caused by the sharp IC current 52 change at time T are reduced, which is achieved by changing the clamp control voltage 56 prior to time T for connecting the clamping device with the power supply line, which results in a linear increase of the clamp current 54 in the shown example.

Figure 4:
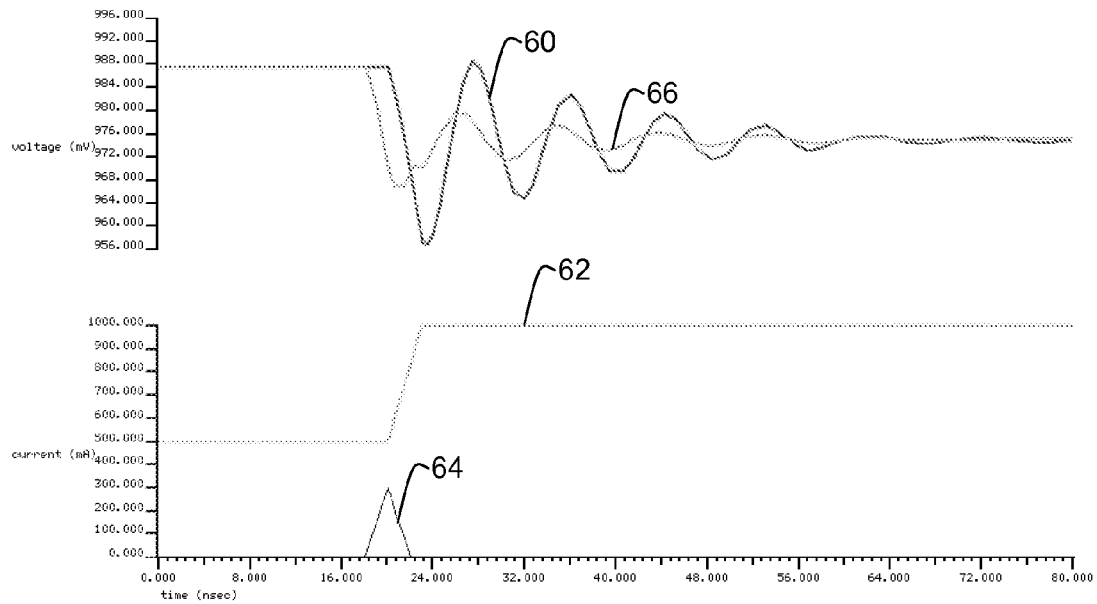
FIG. 4 schematically shows a diagram of simulated supply voltage, clamp current and clamp control voltage reaction on a sharp IC current change.

Referring to FIG. 4, a graph of a supply voltage 60, 66, and clamp current 64 as a function of time from a simulated reaction on a sharp IC current 62 change is shown. As shown, supply voltage 66 ripple is reduced significantly on account of a small clamp current 64 pulse through an ESD clamp transistor as compared with the supply voltage 60 ripple without employing the apparatus described above. In the shown example, the clamp current 64 pulse may have an amplitude of 300 mA, provided by 3 integrated ESD clamp cells for protecting a processing core. Partial opening of the clamping devices may be obtained by, e.g., application of a short clamp current 64 pulse.

In the shown example, the IC current 62 consumption contains a step from 0.5 A (Ampere) to 1 A within 3 nanoseconds (nsec), whereas the shunt current or clamp current 64 applied to compensate for the change or step may be up to 300 mA. Voltage characteristic 60 illustrates a characteristic of a supply voltage without shunt compensation by the clamp current 64, whereas voltage characteristic 66 illustrates a characteristic of a supply voltage with shunt compensation by the clamp current 64, which provides a gain of about 10 mV in the supply voltage amplitude, translated into about 120 MHz.

Figure 5:
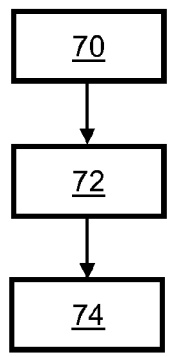
FIG. 5 schematically shows a flowchart of an example of an embodiment of a method for voltage ripple reduction on a power supply line of an integrated circuit device operable in at least two modes.

Referring to FIG. 5, a flowchart of an example of an embodiment of a method for voltage ripple reduction on a power supply line of an integrated circuit device operable in at least two modes is schematically shown. The method shown in FIG. 5 allows implementing the advantages and characteristics of the described apparatus as part of a method for voltage ripple reduction on a power supply line of an integrated circuit device operable in at least two modes. The shown method is a method for voltage ripple reduction on a power supply line of an integrated circuit device operable in at least two modes using an apparatus comprising one or more clamping devices connectable to the power supply line; a clamp control unit; and a mode change detection unit. The method comprises monitoring 70, by the mode change detection unit, an interface of the integrated circuit device for one or more information indicating an upcoming mode change of the integrated circuit device; providing 72, by the mode change detection unit, a mode change signal to the clamp control unit when the one or more information is detected; and connecting 74, by the clamp control unit, at least one of the one or more clamping devices to the power supply line when receiving the mode change signal.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the clamp control unit 32 and the mode change detection unit 34 may be provided as a single unit.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the apparatus 22 and the integrated circuit device 26 may be provided as circuitry located on a single integrated circuit and may, for example, be part of a SOC 20. Alternatively, the example may be implemented as any number of separate integrated circuits or separate devices interconnected with each other in a suitable manner. For example, the clamping devices 28, 30 may be provided externally attached to a power supply pin supplying power to the power supply line 24.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An apparatus for voltage ripple reduction on a power supply line of an integrated circuit device the apparatus comprising:
   one or more clamping devices configured to connect to said power supply line;
   a clamp control unit; and
   a mode change detection unit, coupled to an interface of said integrated circuit device, and arranged to monitor for information indicating an upcoming mode change of said integrated circuit device and to provide a mode change signal to said clamp control unit when said information is detected, wherein said clamp control unit is arranged to connect at least one of said one or more clamping devices to said power supply line when receiving said mode change signal.

2. The apparatus as claimed in claim 1, wherein said mode change detection unit is arranged to provide said mode change signal to said clamp control unit before said mode of said integrated circuit device is changed.

3. The apparatus as claimed in claim 1, comprising an electrostatic discharge current clamping structure comprising said one or more clamping devices.

4. The apparatus as claimed in claim 1, wherein said at least one of said one or more clamping devices is a field effect transistor circuit.

5. The apparatus as claimed in claim 1, wherein said clamp control unit is arranged to connect said one or more clamping devices to said power supply line when receiving an electrostatic discharge trigger signal.

6. The apparatus as claimed in claim 1, wherein said clamp control unit is arranged to select a conductivity level depending on said one or more detected information when connecting said at least one of said one or more clamping devices to said power supply line.

7. The apparatus as claimed in claim 1, wherein said clamp control unit is arranged to connect a set of said one or more clamping devices to said power supply line, depending on said detected information.

8. The apparatus as claimed in claim 1, wherein at least one of said one or more information is a wake-up request for said integrated circuit device.

9. The apparatus as claimed in claim 1, wherein at least one of said one or more information is a voltage scaling request for said integrated circuit device.

10. The apparatus as claimed in claim 1, wherein at least one of said one or more information is a frequency scaling request for said integrated circuit device.

11. A system on a chip, comprising
    an integrated circuit device operable in at least two modes;
    an interface of said integrated circuit device; and
    an apparatus as claimed in claim 1 for voltage ripple reduction on a power supply line of said integrated circuit device.

12. The system on a chip as claimed in claim 11, wherein said integrated circuit device is a processing device.

13. The system on a chip as claimed in claim 11, wherein said interface is a register device.

14. A method for voltage ripple reduction, said method comprising:
    monitoring, by a mode change detection unit, an interface of an integrated circuit device for information indicating an upcoming mode change of said integrated circuit device, wherein the integrated circuit device is operable in at least two modes and comprises the mode detection unit, one or more clamping devices configured to be connected to a power supply line, and a clamp control unit coupled to the clamping devices and the mode change detection unit;
    providing, by said mode change detection unit, a mode change signal to said clamp control unit when said information is detected; and
    connecting, by said clamp control unit, at least one of said one or more clamping devices to said power supply line when receiving said mode change signal.

15. The method as claimed in claim 14 further comprising providing said mode change signal to said clamp control unit before said mode of said integrated circuit device is changed.

16. The method as claimed in claim 14 further comprising connecting said one or more clamping devices to said power supply line when receiving an electrostatic discharge trigger signal.

17. The method as claimed in claim 14 further comprising selecting a conductivity level depending on said detected information when performing said connecting said at least one of said one or more clamping devices to said power supply line.

* * * * *